(12) United States Patent
Abe et al.

(10) Patent No.: US 7,067,734 B2
(45) Date of Patent: Jun. 27, 2006

(54) CABLE MODEM MODULE AND TRANSMITTER-RECEIVER

(75) Inventors: Shuji Abe, Kumagaya (JP); Katsuya Kudo, Fukaya (JP); Tsutomu Isoda, Takasaki (JP); Masami Oosawa, Kumagaya (JP); Mikine Fujihara, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 10/848,064

(22) Filed: May 19, 2004

(65) Prior Publication Data

US 2005/0003685 A1    Jan. 6, 2005

(30) Foreign Application Priority Data

Jun. 6, 2003    (JP)    ............................. 2003-162022

(51) Int. Cl.
*H05K 9/00*    (2006.01)
(52) U.S. Cl. .............................. 174/35 GC; 174/35 R; 361/816
(58) Field of Classification Search .............. 174/35 R, 174/35 MS, 35 GC; 361/816, 818, 800
See application file for complete search history.

(56) References Cited

U.S. PATENT DOCUMENTS

| 4,677,037 A | 6/1987 | Takabayashi |
| 4,962,462 A | 10/1990 | Fekete |
| 4,968,566 A | 11/1990 | Lersch et al. |
| 5,329,066 A * | 7/1994 | Hansson ...................... 174/151 |
| 5,780,980 A | 7/1998 | Naito |
| 5,916,699 A | 6/1999 | Thomas et al. |
| 5,964,309 A | 10/1999 | Kimura et al. |
| 5,970,055 A | 10/1999 | Park et al. |
| 6,118,069 A * | 9/2000 | Tamura et al. ............ 174/35 R |
| 6,326,097 B1 | 12/2001 | Hockaday |
| 6,373,711 B1 * | 4/2002 | Yamauchi et al. .......... 361/752 |
| 6,404,309 B1 * | 6/2002 | Hall et al. ..................... 334/85 |
| 2001/0048593 A1 * | 12/2001 | Yamauchi et al. .......... 361/807 |
| 2002/0056134 A1 | 5/2002 | Abe et al. |
| 2003/0159844 A1 * | 8/2003 | Wolf et al. ............... 174/35 R |
| 2004/0246687 A1 | 12/2004 | Abe et al. |
| 2004/0248436 A1 | 12/2004 | Abe et al. |

FOREIGN PATENT DOCUMENTS

| EP | 1 091 437 A1 | 4/2001 |
| EP | 1 233 468 A2 | 8/2002 |
| GB | 1131171 | 10/1968 |
| GB | 1 304 092 | 1/1973 |
| JP | 3-224295 | 10/1991 |

(Continued)

OTHER PUBLICATIONS

Jaesung Han et al., "Direct methanol fuel-cell combined with a small back-up battery," Journal of Power Sources 112, Elsevier Science B.V., pp. 477-483, (Aug. 3, 2002).

*Primary Examiner*—Hung V. Ngo
(74) *Attorney, Agent, or Firm*—Pillsbury Winthrop Shaw Pittman, LLP

(57) ABSTRACT

A cable modem module device includes a coaxial connector to transmit and receive high-frequency signals, a circuit board to which the coaxial connector is attached to protrude from its periphery in a direction parallel to its surface, and a first shield case formed in its portion corresponding to the coaxial connector with a cutout portion to avoid the coaxial connector so as to allow the circuit board to be housed from a direction perpendicular to the surface of the circuit board.

8 Claims, 6 Drawing Sheets

FOREIGN PATENT DOCUMENTS

| | | |
|---|---|---|
| JP | 8-32267 | 2/1996 |
| JP | 10-75082 | 3/1998 |
| JP | 11-103427 | 4/1999 |
| JP | 2002-16524 | 1/2002 |
| JP | 2002-63920 A | 2/2002 |
| JP | 2002-198077 A | 7/2002 |
| WO | WO 98/56058 | 12/1998 |
| WO | WO 01/79012 A2 | 10/2001 |
| WO | WO 2004/031929 A1 | 4/2004 |
| WO | WO 2004/032269 A2 | 4/2004 |

* cited by examiner

CABLE MODEM MODULE AND TRANSMITTER-RECEIVER

CROSS-REFERENCE TO RELATED APPLICATIONS

This application is based upon and claims the benefit of priority from prior Japanese Patent Application No. 2003-162022, filed Jun. 6, 2003, the entire contents of which are incorporated herein by reference.

BACKGROUND OF THE INVENTION

1. Field of the Invention

The present invention relates to a cable modem module which permits unwanted radiation from a signal terminal mounted on a circuit board adapted to process a signal input thereto or output therefrom over a coaxial connector to be reduced, which may be superimposed on the input signal or output signal. The present invention also relates to a transmitter-receiver which has such a cable modem module built in.

2. Description of the Related Art

In a transmitter-receiver which receives a signal from outside or transmits a signal processed by an internal circuit to the outside over a radio-frequency (RF) cable (coaxial connector), the circuit board is housed in a shield case made of metal or the like which has the effect of preventing or reducing unwanted radiation of electromagnetic waves. This prevents unwanted radiation from being superimposed on a receive signal to be processed by the circuit board or a signal produced by the circuit board.

However, as the demand has increased for downsizing transmitter-receivers, the space between the shield case which shields the circuit board and the outer case of the transmitter-receiver has been reduced. For this reason, some accommodation will be required in the manufacturing process, for example, such as mounting an RF connector in a given position on the shield case after the installation of the shield case in the transmitter-receiver.

Japanese Unexamined Patent Publication No. 8-32267 (FIGS. 1 and 2 and paragraphs [0011], [0013] and [0014]) discloses an electronic equipment case in which a radio-frequency circuit board provided with an F-type connector is sandwiched between first and second shield plates and the resulting structure is covered with a case body made of resin and a cover so that the entry of water and rain is prevented.

Moreover, Japanese Unexamined Patent Publication No. 10-75082 (FIGS. 5 to 7, 11 and 12 and paragraphs [0014], [0015], [0023] and [0028]) discloses a thin wireless device which has a metal-plated resin fixing frame which encloses a circuit board assembly provided with a connector for connection to an antenna and a metal case which houses the fixing frame and the circuit board assembly.

Furthermore, Japanese Unexamined Patent Publication No. 3-224295 (FIG. 1, lines 1 to 20 in the lower left column on page 3, and claim 1) discloses a built-up structure of a modem housing in which a circuit board is covered with upper and lower covers (including sides), a front panel, and a rear panel which are molded out of a resilient resin material.

Additionally, Japanese Unexamined Patent Publication No. 2002-16524 (FIGS. 1 and 6, paragraphs [0061] to [0068], and claim 11) discloses a transmitter-receiver radio-frequency device in which a circuit board integrally provided with a coaxial cable attachment unit has its four sides covered with shield plates, thereby enhancing communication quality.

Even if the techniques disclosed in the afore-mentioned four Patent Publications are selectively combined to shield the circuit board, it-is difficult to completely suppress unwanted radiation.

Due to the reduced space between the shield case that shields the circuit board and the outer case of the transmitter-receiver resulting from the downsizing requirement of the transmitter-receiver, the manu-facturing step of mounting the RF connector requires some accommodation. For this reason, the working performance and the assembly efficiency are reduced.

In addition, for example, when a group of terminals protruding from the circuit board and the RF connector are oriented in different directions, trying to house the shield case which contains the RF connector and the circuit board in an outer case with little room may result in the terminals being broken or deformed.

BRIEF SUMMARY OF THE INVENTION

According to one aspect of the present invention, there is provided a cable modem module device comprising: a coaxial connector to transmit and receive high-frequency signals; a circuit board to which the coaxial connector is attached to protrude from its periphery in a direction parallel to its surface; and a first shield case formed in its portion corresponding to the coaxial connector with a cutout portion to avoid the coaxial connector so as to allow the circuit board to be housed from a direction perpendicular to the surface of the circuit board.

According to another aspect of the present invention, there is provided a transmitter-receiver comprising: a cable modem module having a coaxial connector to transmit or receive high-frequency signals, a circuit board to which the coaxial connector is attached to protrude from its periphery in a direction parallel to its surface, and a first shield case formed in its portion corresponding to the coaxial connector with a cutout portion to avoid the coaxial connector so as to allow the circuit board to be housed from a direction perpendicular to the surface of the circuit board; and a power supply unit which supplies power to the cable modem module, the cable modem module being operated from power supplied from the power supply unit to transmit or receive high-frequency signals.

BRIEF DESCRIPTION OF THE SEVERAL VIEWS OF THE DRAWING

FIG. 6 is a diagram illustrating another example of a transmitter-receiver which has the cable modem module built in.

DETAILED DESCRIPTION OF THE INVENTION

Figure 1:
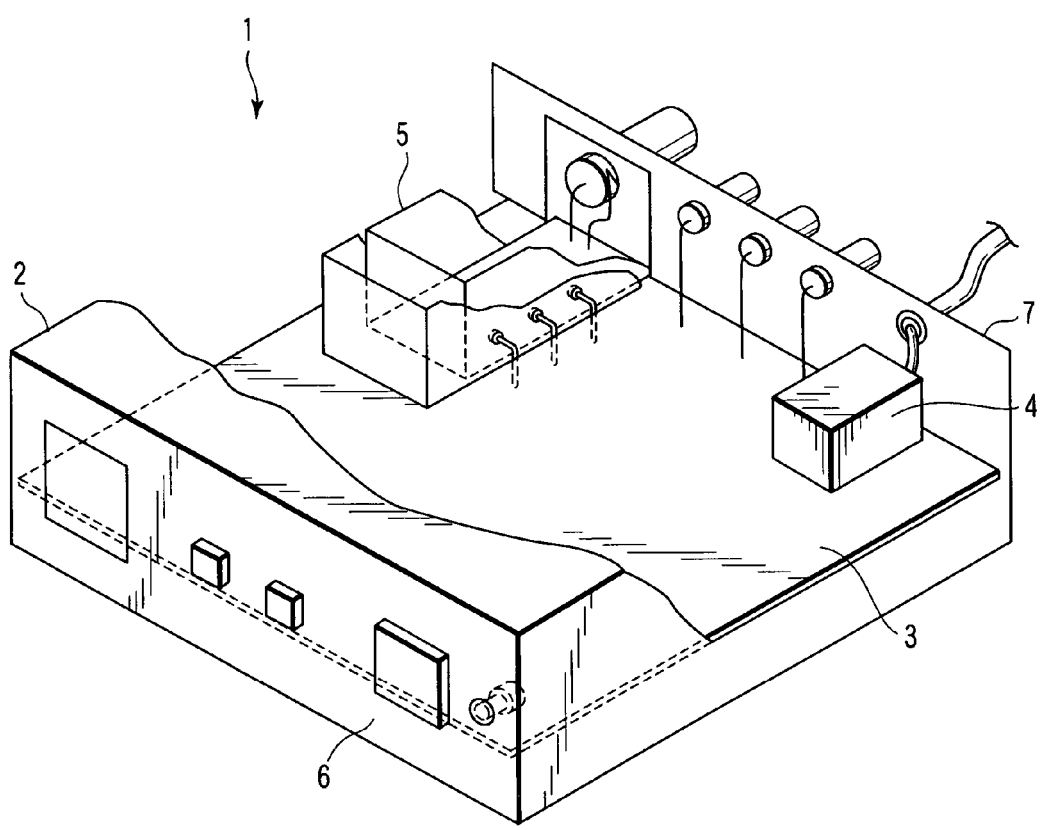
FIG. 1 is a perspective view of a CATV terminal device as an example of a transmitter-receiver which has a cable modem module built in according to an embodiment of the present invention.

An embodiment of the present invention will be described hereinafter in detail with reference to the accompanying drawings. FIG. 1 shows a cable television (CATV) terminal device as a data communications terminal, indicated generally at 1, which is connected to a CATV network and allows a subscriber to receive video programs, music programs, or character data transmitted from a station and information entered by him or her to be transmitted to the program transmitting station.

Video signals or character data are transmitted from the center station to each terminal (subscriber) via receive signals (down signals) of high frequencies of the order of, say, 90 to 860 MHz. On the other hand, information can be transmitted from each terminal to the center station via transmit signals of high frequencies of the order of, say, 5 to 65 MHz.

As shown in FIG. 1, the CATV terminal device 1 includes an outer case 2, a main circuit board 3, a power supply circuit board 4, a cable modem module 5, a front panel 6, and a rear panel 7.

Though not described in detail, on the front panel 6 are mounted a display device which indicates the presence or absence of incoming mail or the like from a receive channel or center station, a power switch, a phono jack for audio output, a light receiver adapted to receive control signals from a remote controller, and so on.

Though not described in detail, on the rear panel 7 are mounted video output terminals adapted to output a video signal to a display unit, such as a cathode ray tube (CRT), audio terminals adapted to output audio signals to the display unit or an audio reproducing system, an AC line which supplies commercial power to the power supply circuit board 4, an RF connector provided in a predetermined position on the cable modem module 5, and so on. The RF connector will be described below.

Figure 2:
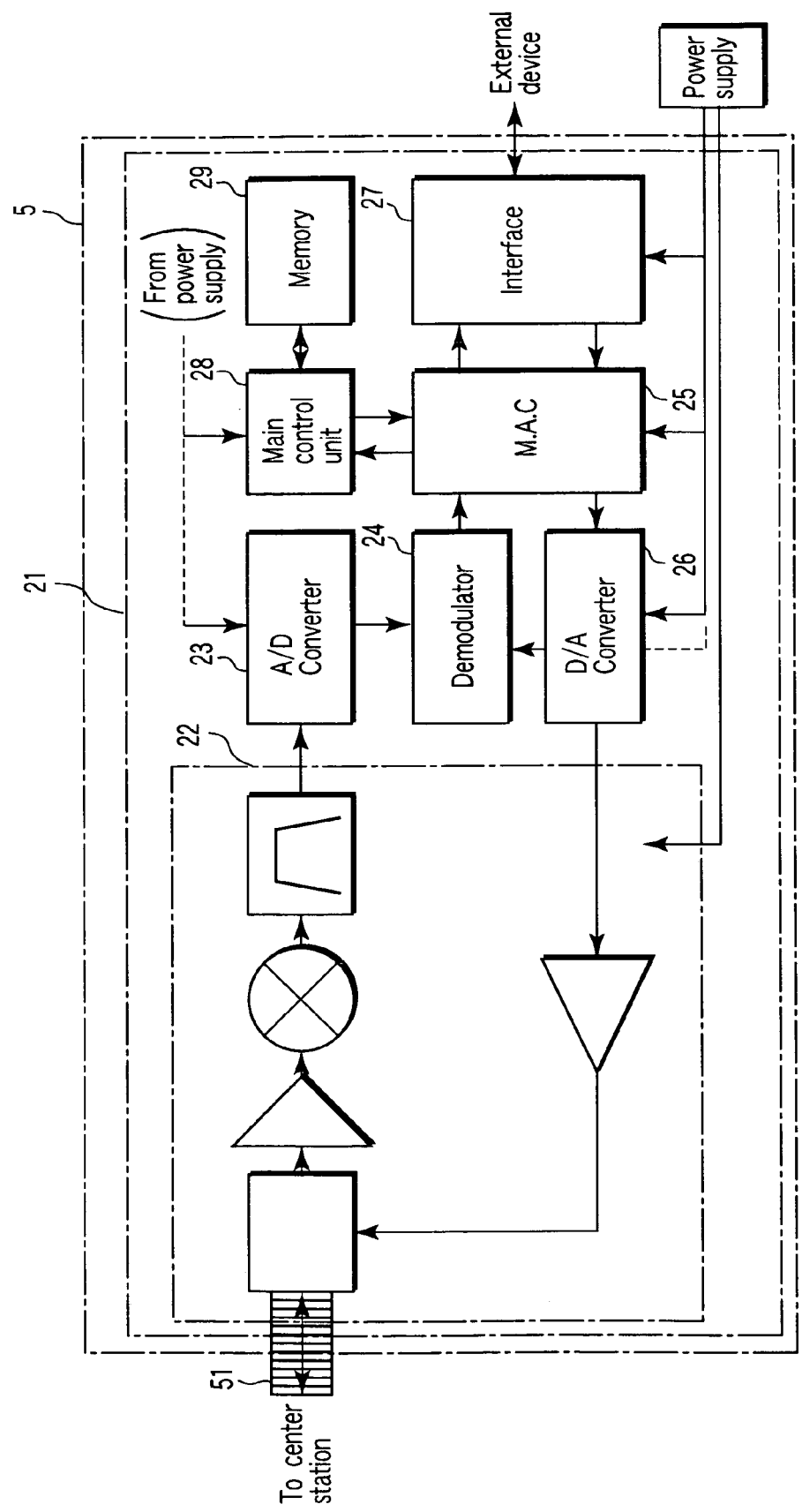
FIG. 2 is a block diagram of the signal processing system of the cable modem module built into the CATV terminal device of FIG. 1.

The cable modem module 5 is composed of as shown in FIG. 2, an RF connector (coaxial connector) 51 to which an RF cable is connected, which is used to transmit or receive signals to or from the center station (CATV broadcast station), a circuit board 21 on which various circuits and functional blocks to be described below are mounted, a tuner unit 22 adapted to process high-frequency signals input or output through the RF connector 51, an analog-to-digital converter 23 adapted to convert down signals (analog signals) frequency-converted by the tuner unit 22 into digital signals, a demodulator unit 24 adapted to demodulate down signals which have been converted into digital signals by the analog-to-digital converter 23 to provide data, a media access control (MAC) unit 25 adapted to produce up signals (digital signals), a digital-to-analog converter 26 adapted to convert the up signals produced by the MAC unit 25 into analog signals, an interface 27 which conforms to the Ethernet standard to output down signals input to the MAC unit 25 to external equipment, a main control circuit (microcomputer) 28 which controls the operations of various circuits and functional blocks, and a memory 29. The cable modem module 5 is mounted in a predetermined position on the main circuit board 3 in a state in which the RF connector 51 projects to the outside in a predetermined position on the rear panel 7, for example.

The RF connector 51 is fixed in position to the circuit board 21 by means of, for example, soldering, caulking, or contact shoe. The RF connector 51 is fixed to the circuit board 21 so that its core, or the signal line protrudes from the periphery of the circuit board 21 to outside in a direction parallel to the surface of the circuit board 21. Alternatively, the RF connector 51 may be fixed to the circuit board 21 in such a way that the tip portion of the core is bent perpendicular to the surface of the circuit board 21 and inserted into the circuit board 21. The power for driving the cable modem module 5 is supplied from the power supply circuit board 4 placed on the main circuit board 3.

Figure 3:
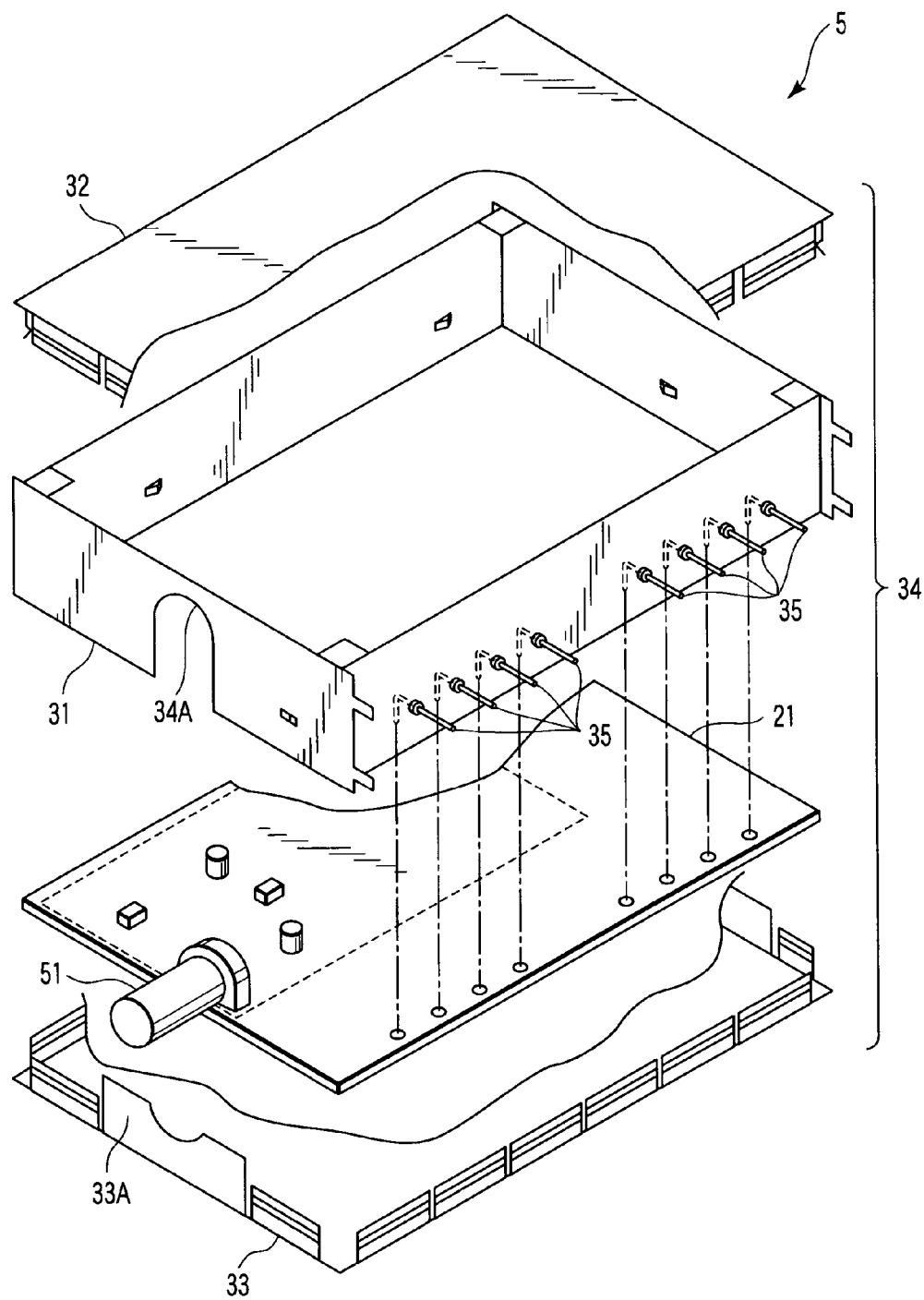
FIG. 3 is an exploded perspective view illustrating an example of the structure of the cable modem module placed on the main circuit board in the CATV terminal device of FIG. 1.

FIG. 3 shows an example of the structure of the cable modem module 5 placed on the main circuit board 3 of the CATV terminal device 1 shown in FIG. 1. The cable modem module 5 has a shield case 34 which has the shape of a hexahedron or the like and is composed of a frame-like metal case 31, a first cover 32, and a second cover 33. The metal case 31 encloses the circuit board 21 provided with various circuits and functional blocks described with reference to FIG. 2 on four sides in the direction perpendicular to the surface of the circuit board 21 and shields the circuit board 21 from external electromagnetic waves. The first cover 32 covers one of the openings of the metal case 31, i.e., functions as a lid for that opening and shields the circuit board 21 from external electro-magnetic waves. The second cover 33 covers the other opening of the metal case 31, i.e., functions as a lid for that opening and shields against external electromagnetic waves.

A predetermined number of terminals 35 used to input or output signals to or from various circuits and functional blocks described with reference to FIG. 2 are arranged in position on the circuit board 21. Each of the terminals 35 contains a through capacitor to filter external noise or unwanted signals.

Each of the terminals 35 penetrates the predetermined side of the shaped metal case 31 in the form of a tetrahedron and protrudes therefrom for connection to the outside of the shield case 34. In the actual manufacturing process, the terminals 35 are fixed in advance to a predetermined side of the shield case 34, then inserted into corresponding holes provided in the circuit board 21 and connected to circuit patterns on the circuit board 21 by soldering, for example. That is, the end portion of each terminal 35 to be connected to the circuit board 21 is bent in a direction parallel to the direction of axis of the corresponding through hole formed in advance in the circuit board 21.

The shield case 34 is formed with a cutout portion 34A in its predetermined side, i.e., in a side different from the side of the tetrahedron-shaped metal case 31 to which the terminals 35 are fixed, in order to avoid the RF connector 51 fixed to the circuit board 21 and allow it to be exposed to the outside of the shield case 34.

That is, the provision of the cutout portion 34A corresponding to the RF connector 51 in a given side of the tetrahedron-shaped metal case 31 allows the metal case 31 to be fitted to the circuit board 21 in a direction perpendicular to the axis of the RF connector 51 which has been fixed to the circuit board 21 so that the end portion of each of the terminals 35 which is to be inserted into a corresponding through hole in the circuit board 21 becomes parallel to the axis of that through hole.

Thus, in fitting the metal case 31 to the circuit board 21, the provision of the cutout portion 34A of such a shape as avoids the RF connector 51 fixed to the circuit board 21 in a given side of the tetrahedron-shaped metal case 31 which encloses the circuit board 21 allows the end portions of the terminals 35 fixed to the metal case 31 to be inserted vertically into the corresponding holes of the circuit board 21 with the metal case 31 and the circuit board 21 kept horizontal.

In other words, by forming the cutout portion 34A in a given side of the metal case 31 so that the metal case 31 can be fitted to the circuit board 21 from the direction perpendicular to the direction in which the RF connector 51 extends, the circuit board 21 can be housed in the metal case 31 from the direction perpendicular to the surface of the circuit board 21.

This configuration prevents undesired contact of the RF connector 51 and the metal case 31 and allows the end portions of the terminals 35 fixed to the metal case 31 to be inserted into the corresponding through holes of the circuit board 21 with certainty. If the terminals were not inserted into the corresponding through holes with certainty, they might be bent.

For this reason, it becomes possible to prevent undesired flaws from being produced in either or both of the RF connector 51 and the terminals 35 and the terminals from being bent undesirably. In addition, the process of fitting the metal case 31 to which the terminals 35 have been attached in advance to the circuit board 21 to which the RF connector 51 is fixed becomes easy and hence the time required to perform the process is reduced.

This allows the assembly cost of the cable modem module 5 itself and the CATV terminal device 1 containing the cable modem module 5 to be reduced, resulting in a reduction in the cost of the end product.

By protruding (or bending) that portion of the second cover 33 which covers the other opening of the tetrahedron-shaped metal case 31 which is close to the RF connector 51 fixed to the circuit board 21 toward the side of the metal case 31 to thereby form a shielding portion 33A in the vicinity of the RF connector 31, the area of the opening (the cutout portion 34A) formed in the metal case 31 is reduced. The shielding portion 33A need not be integral with the second cover 33 but may be a separate piece.

This configuration allows incoming unwanted radiation or outgoing unwanted radiation produced by the internal circuits of the cable modem module 5 via the opening or the cutout portion 34A to be reduced. For this reason, the transmission and reception of signals of high quality can be made possible.

With the shield case 34 shown in FIG. 3, although the metal case 31 in the form of a tetrahedron has two open sides, the first cover 32 can be formed integral with the metal case 31, in which case the metal case will have one open side.

Figure 4:
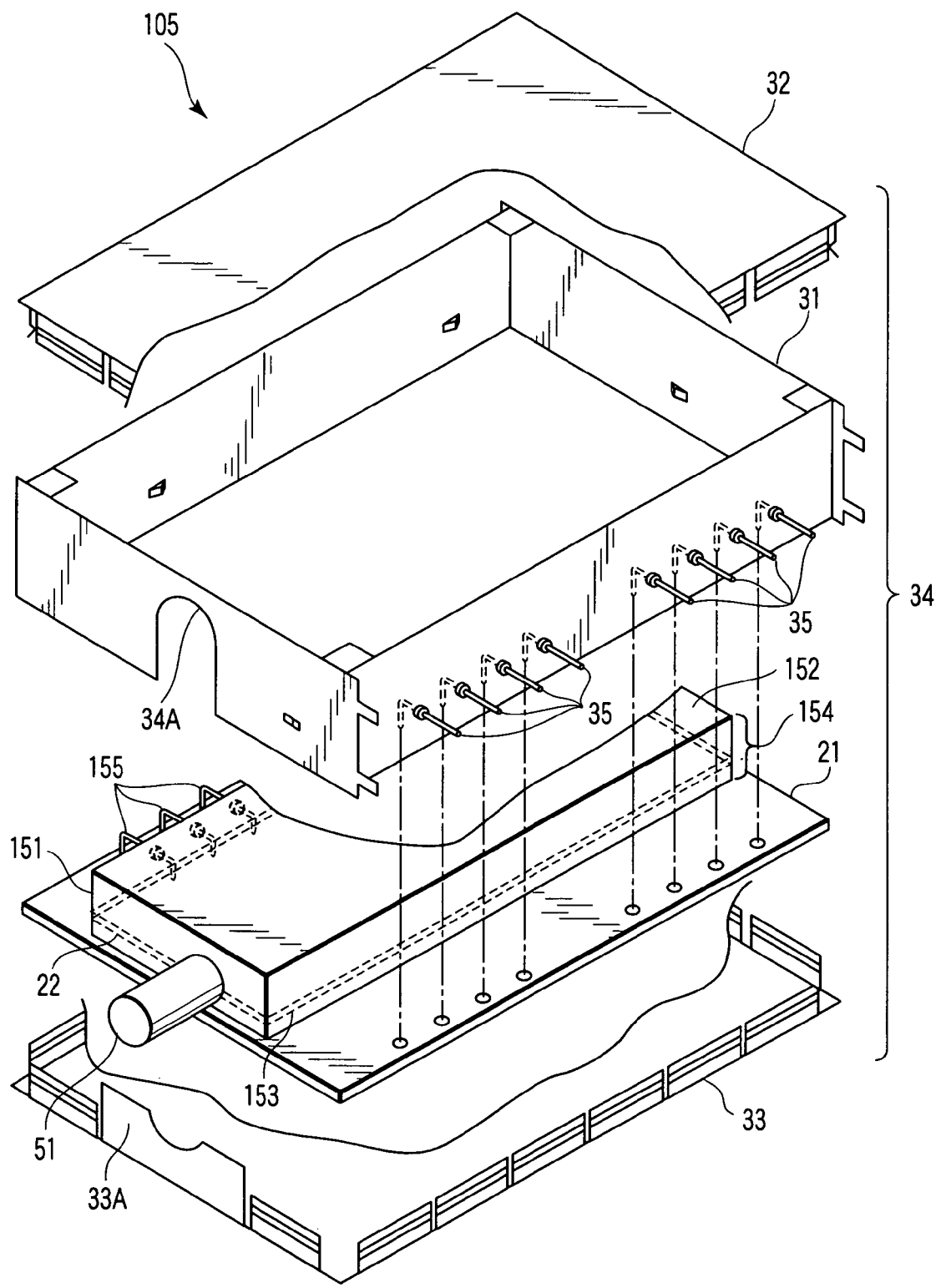
FIG. 4 is an exploded perspective view illustrating another example of the structure of the cable modem module placed on the main circuit board in the CATV terminal device of FIG. 1.

FIG. 4 shows a modification of the cable modem module shown in FIGS. 1 to 3. In the example of FIG. 4, the tuner 22 to be placed on the circuit board 21 of the cable modem module is housed in a separate shield case 154.

In detail, the cable modem module 105 is provided with a tuner shield case 154 which is in the form of a box consisting of at least five metal sides and has a frame-like metal case 151 and a tuner cover 152. The metal case 151 encloses a circuit board 153 for the tuner unit 22 to be placed on the circuit board 21 on four sides and shields the tuner from external electromagnetic waves. The tuner cover 152 covers one of the openings of the metal case 151 in the form of a tetrahedron and shields the tuner from external electromagnetic waves. The tuner shield case 154 is covered with the shield case 34 together with the circuit board 21. The RF connector 51 is attached to the circuit board 153 and protrudes from one side of the metal case 151.

A predetermined number of terminals 155 used to input or output signals to or from the tuner unit 22 are arranged on one of the sides of the metal case 151 in the form of a tetrahedron. The terminals 155 are preferably arranged on the opposite side from the side of the shield case 34 on which the terminals 35 are arranged.

Each of the terminals 35 fixed to a predetermined side of the shield case 151 in the form of a tetrahedron is inserted into a corresponding one of through holes (not shown) formed in position on the circuit board 21 and connected to a given circuit pattern on the circuit board 21 by soldering, for example. That is, the opposite end portion of each terminal 35 from its end portion fixed to the metal case 151 is bent in a direction parallel to the axis of the corresponding through hole formed in advance in the circuit board 21.

The shield case 34 is formed with a cutout portion 34A in its predetermined side, i.e., in a side different from the side of the tetrahedron-shaped metal case 31 to which the terminals 35 are fixed, in order to allow exposure of the RF connector 51 fixed to the circuit board 21 to the outside of the shield case 34.

For this reason, in the example of FIG. 4, the metal case 31 can be mounted to the circuit board 21 in a direction perpendicular to the axis of the RF connector 51 protruding from the tuner shield case 154, i.e., so that the end portion of each of the terminals 35 which is to be inserted into a corresponding through hole in the circuit board 21 is aligned with the axis of that through hole.

In other words, by forming the cutout portion 34A in a given side of the metal case 31 so that the metal case 31 can be mounted to the circuit board 21 from the direction perpendicular to the direction in which the RF connector 51 fixed to the circuit board 153 along the direction of its surface extends, the circuit board 21 can be housed in the metal case 31 from the direction perpendicular to the surface of the circuit board 21.

This configuration prevents undesired contact of the RF connector 51, the metal case 31 and the metal case 151 and allows the terminals 35 and 155 to be inserted into the corresponding through holes of the circuit board 21 with certainty. If the terminals were not inserted into the corresponding through holes with certainty, they might be bent.

For this reason, it becomes possible to prevent undesired flaws from being produced in the RF connector 51 and/or the terminals 35 and 155 and the terminals from being bent undesirably. In addition, the process of fitting the metal cases 31 and 151 to which the terminals 35 and 155 have been attached in advance to the circuit board 21 to which the RF connector 51 is fixed becomes easy and hence the time required to perform the process is reduced.

This allows the assembly cost of the cable modem module 5 itself and the CATV terminal device 1 containing the cable modem module 5 to be reduced, resulting in a reduction in the cost of the end product.

By protruding (or bending) that portion of the second cover 33 which covers the other opening of the tetrahedron-shaped metal case 31 which is close to the RF connector 51 fixed to the circuit board 21 toward the side of the metal case 31 to thereby form a shielding portion 33A in the vicinity of the RF connector 31, the area of the opening (the cutout portion 34A) formed in the metal case 31 is reduced. The shielding portion 33A need not be integral with the second cover 33 but may be a separate piece.

This configuration allows incoming unwanted radiation or outgoing unwanted radiation produced from the internal circuits of the cable modem module 5 via the opening based on the cutout portion 34A to be reduced. For this reason, the transmission and reception of signals of high quality can be made possible.

The embodiments shown in FIGS. 3 and 4 are effective even in the case where a part which protrudes from the shield case is not an RF connector.

Figure 5:
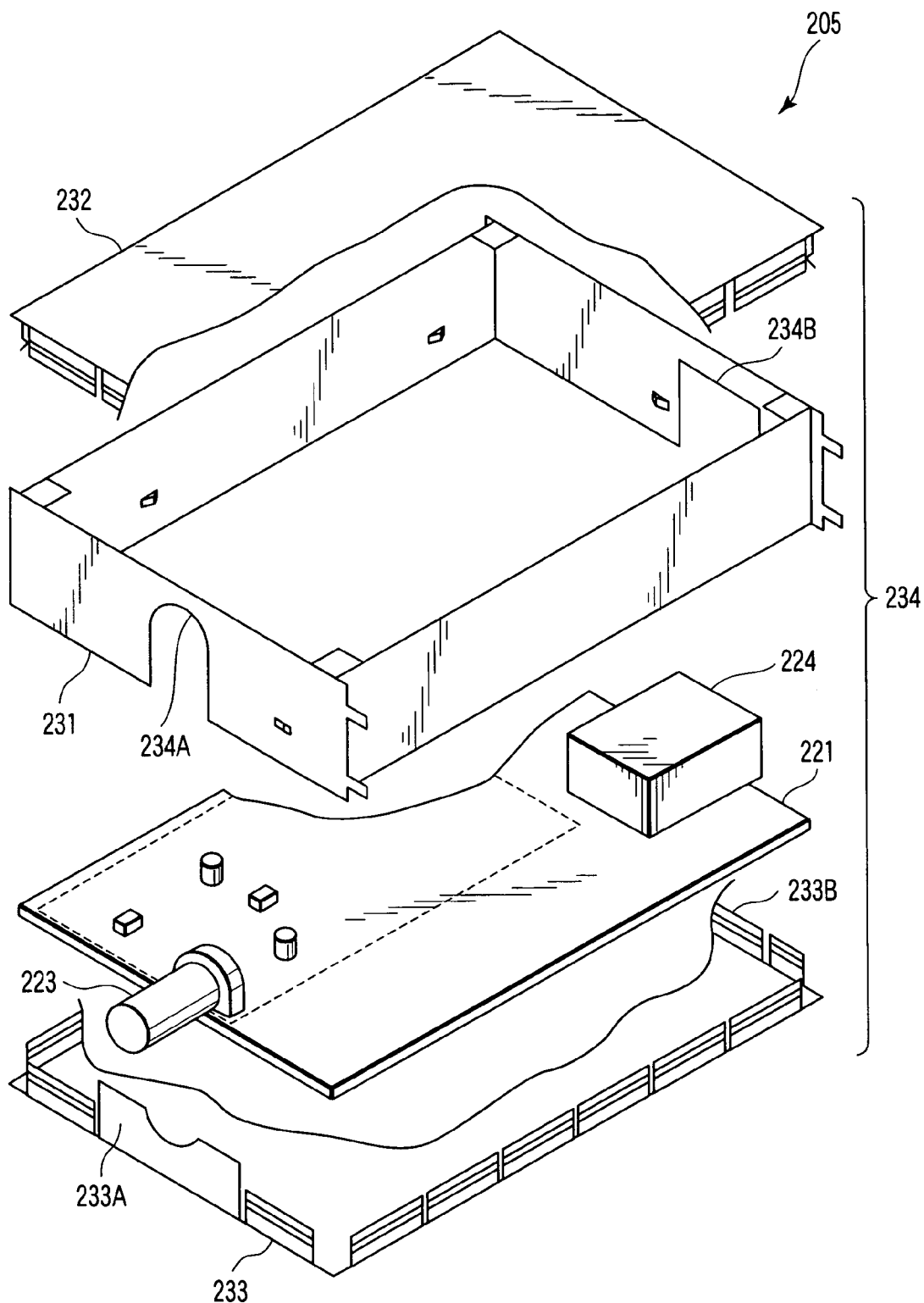
FIG. 5 is an exploded perspective view illustrating still another example of the structure of the cable modem module placed on the main circuit board in the CATV terminal device of FIG. 1.

For example, as shown in FIG. 5, suppose that parts 223 and 224 placed on different sides of a circuit board 221 protrude from a shield case 234 to outside. In such a case, by forming cutout portions 234A and 234B in a metal case 231, the same advantages as in the examples of FIGS. 3 and 4 can be obtained.

In addition, by providing a lower cover 233 for the open side of a metal case 231 in the form of a tetrahedron with shielding portions 233A and 233B, the areas of openings corresponding to the cutout portions 234A and 234B formed in the shield case 234 are reduced as in the case of the examples of FIGS. 3 and 4. The shielding portions 233A and 233B adapted to cover the cutout portions 234A and 234B need not be integral with the cover 233 but may be separate pieces.

This configuration allows incoming unwanted radiation or outgoing unwanted radiation produced from the internal circuits (circuit board 221) of a cable modem module 205 via the openings based on the cutout portions 234A and 234B to be reduced. For this reason, the transmission and reception of signals of high quality can be made possible.

Although the invention has been described so far in terms of a cable modem module incorporated into a CATV terminal device with reference to FIGS. 1 to 5, the principles of the invention are also applicable to a terminal device, such as a game console, as will be described below with reference to FIG. 6.

Figure 6:
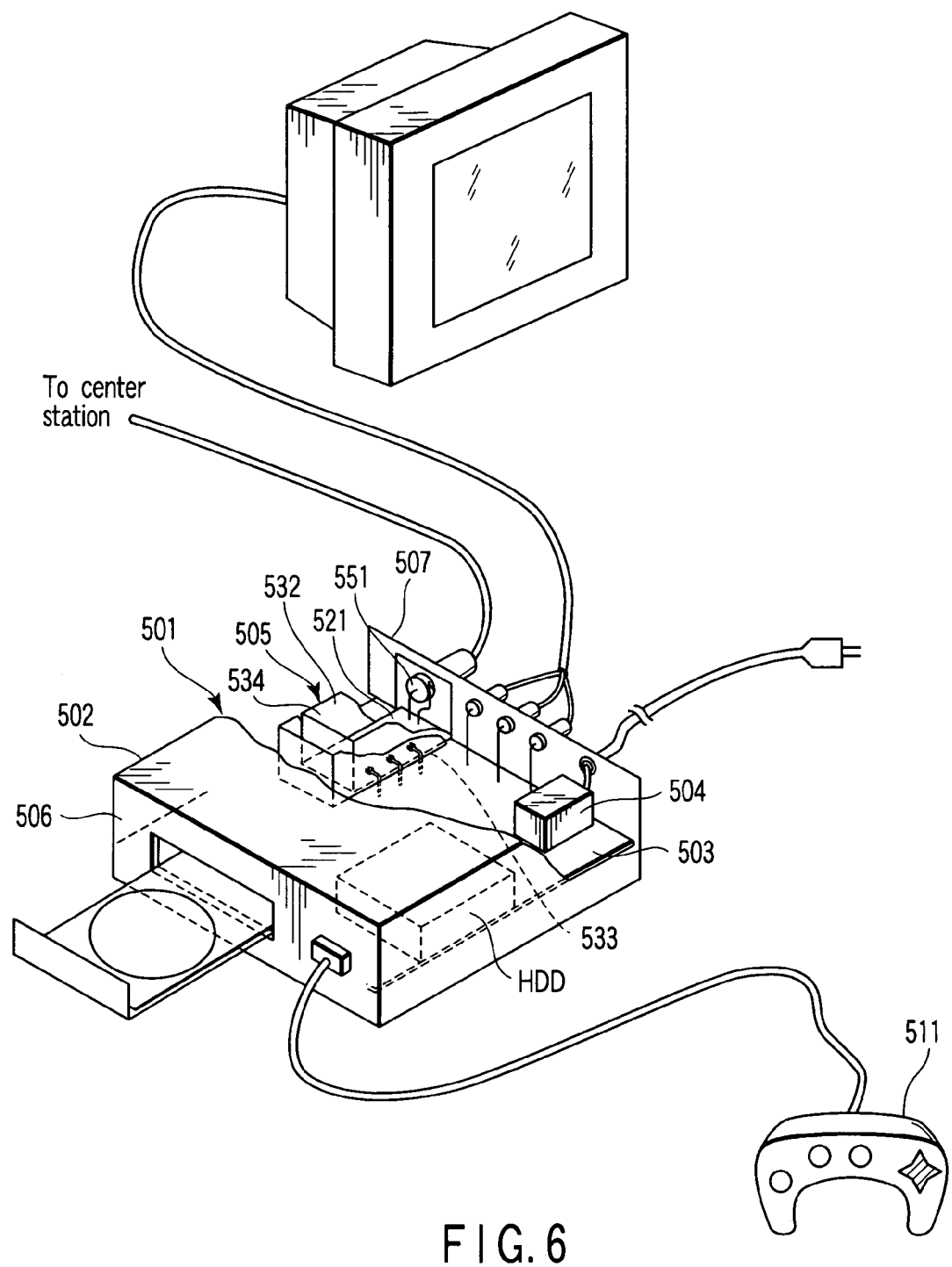

For example, a game console 501 shown in FIG. 6 includes an outer case 502, a main circuit board 503, a power supply circuit board 504, a cable modem module 505, a front panel 506, and a rear panel 507. Though not described in detail, a controller (input device) 511 is connectable to the front panel 506.

The game console 501 shown in FIG. 6 includes a hard disk drive (HDD) which can store game software applications which can be downloaded from a center station, the latest versions of data, high-score data, etc., and a communication unit which allows communications with a competitor entered in the center station for competitive fighting games to be established or cut off.

To provide for a case where the main portion of game software is supplied through a disk medium that conforms to the DVD standard or a storage medium (a cartridge or card) that meets a specific standard, the game console may be provided with a disk drive and a card (cartridge) slot.

Though not described in detail, the cable modem module 505 in which an RF connector 551 is attached to its circuit board 521 is fixed in position to the main circuit board 503 as in the case of FIG. 3 or 4.

Since the cable modem module 505 is shielded by a shield case 534, an upper cover 532, and a lower case 533, incoming unwanted radiation to the circuit board 521 or outgoing unwanted radiation from the circuit board is reduced.

For this reason, the use of the inventive cable modem module (shield mechanism) allows signals of high quality to be transmitted or received.

The present invention is not limited to the embodiments described above. At the stage of practice of the invention, constituent elements can be variously modified without departing from the scope and spirit thereof. The constituent elements disclosed in the above embodiments can be combined appropriately to form various inventions. For example, some components may be removed from all the constituent elements shown in the embodiments. In addition, the constituent elements in the different embodiments may be combined appropriately.

What is claimed is:

1. A cable modem module device comprising:
   a coaxial connector to transmit and receive high-frequency signals;
   a circuit board to which the coaxial connector is attached to protrude from its periphery in a direction parallel to its surface; and
   a first shield case formed in its portion corresponding to the coaxial connector with a cutout portion to avoid the coaxial connector so as to allow the circuit board to be housed from a direction perpendicular to the surface of the circuit board;
   wherein the first shield case has a case which has sides in the form of a frame which are perpendicular to the surface of the circuit board and cover the periphery of the circuit board and is formed with the cutout portion to avoid the coaxial connector in a predetermined one of its sides which corresponds to the coaxial connector, and covers which cover the openings of the case enclosed with its sides in the form of a frame.

2. A cable modem module device according to claim 1, wherein the circuit board includes an analog signal processing unit which transmits or receives high-frequency signals via the coaxial connector, a digital signal processing unit which digital-processes signals input to or output from the analog signal processing unit, and a shield case which houses the analog signal processing unit.

3. A cable modem module device according to claim 1, wherein the cover has a shielding portion which shields part of the opening formed by the cutout portion of the case.

4. A cable modem module device according to claim 1, further comprising terminals which are fixed to one of the sides of the case and have their one end portions bent in a direction in which they are inserted into through holes formed in the circuit board in housing the circuit board in the case from a direction perpendicular to the surface of the circuit board.

5. A transmitter-receiver comprising:
   a cable modem module having a coaxial connector to transmit or receive high-frequency signals, a circuit board to which the coaxial connector is attached to protrude from its periphery in a direction parallel to its surface, and a first shield case formed in its portion corresponding to the coaxial connector with a cutout portion to avoid the coaxial connector so as to allow the circuit board to be housed from a direction perpendicular to the surface of the circuit board; and
   a power supply unit which supplies power to the cable modem module,
   wherein the cable modem module operates on power supplied from the power supply unit to transmit or receive high-frequency signals and
   wherein the first shield case has a case which has sides in the form of a frame which are perpendicular to the surface of the circuit board and cover the periphery of the circuit board and is formed with the cutout portion to avoid the coaxial connector in a predetermined one of its sides which corresponds to the coaxial connector, and covers which cover the openings of the case enclosed with its sides in the form of a frame.

6. A transmitter-receiver according to claim 5, wherein the cover has a shielding portion which shields part of the opening formed by the cutout portion of the case.

7. A transmitter-receiver according to claim 5, further comprising terminals which are fixed to one of the sides of the case and have their one end portions bent in a direction in which they are inserted into through holes formed in the circuit board in housing the circuit board in the case from a direction perpendicular to the surface of the circuit board.

8. A transmitter-receiver according to claim 5, wherein the circuit board includes an analog signal processing unit which transmits or receives high-frequency signals via the coaxial connector, a digital signal processing unit which digital-processes signals input to or output from the analog signal processing unit, and a shield case which houses the analog signal processing unit.

* * * * *